US006327367B1

(12) United States Patent
Vercoe et al.

(10) Patent No.: US 6,327,367 B1
(45) Date of Patent: Dec. 4, 2001

(54) SOUND EFFECTS CONTROLLER

(76) Inventors: G. Scott Vercoe, 5095 Washington St., West Roxbury, MA (US) 02132; Alexandre Burton, 6380 de Chateaubriand, Montreal, Quebec (CA), H2S 2N4

( * ) Notice: Subject to any disclaimer, the term of this patent is extended or adjusted under 35 U.S.C. 154(b) by 0 days.

(21) Appl. No.: 09/312,691

(22) Filed: May 14, 1999

(51) Int. Cl.[7] ................................ H03G 3/00; G10H 7/00

(52) U.S. Cl. ................................ 381/61; 84/662; 84/626

(58) Field of Search ................................ 381/61; 84/626, 84/662, 701

(56) References Cited

U.S. PATENT DOCUMENTS

| | | | | |
|---|---|---|---|---|
| 4,481,854 | | 11/1984 | Dugas | 84/1.19 |
| 5,399,799 | * | 3/1995 | Gabriel | 84/609 |
| 5,403,970 | * | 4/1995 | Aoki | 84/626 |
| 5,541,358 | * | 7/1996 | Wheaton et al. | 84/645 |
| 6,011,212 | * | 1/2000 | Rigopulos et al. | 84/667 |

OTHER PUBLICATIONS

Barry Vercoe, et al., World Wide Web page http://www.leeds.ac.uk/music/Man/Csound/title.html, "The Csound Manual (version3.48)", Feb. 17, 1999, pp. 1–19.

Lipscomb, Eric, World Wide Web page http://www.eeb.ele.tue.nl/midi/intro.html, "Introduction into MIDI", Jan. 18, 1999, pp. 1–5.

Analog Devices, Inc., "ADSP–2100 Family DSP Microcomputers", 1996, pp. 1–62.

Analog Devices, Inc., "Low Cost DSP Microcomputers", 1996, pp. 1–36.

* cited by examiner

*Primary Examiner*—Forester W. Isen
*Assistant Examiner*—Brian T. Pendleton
(74) *Attorney, Agent, or Firm*—Cesari and McKenna, LLP

(57) ABSTRACT

A self-contained audio effects processor has a handheld joystick from which both position-dependent and state-dependent effects are effectuated by means of motion of the joystick as well as by actuation of one or more buttons on the joystick. The position-dependent effects control the degree to which an effect is produced, e.g., the amount of intentional distortion applied to a signal, the amount of pitch-shift, etc.; these effects are produced primarily by selective directional motion of the joystick by the user. The state-dependent effects define the particular effect to be imparted to a signal being processed or produced in the processor, e.g., distortion, pitch-shift, etc.; these effects are selected largely by one more or buttons on the joystick which are preferably accessible from the same hand that grips the stick, thus providing a natural and convenient "feel" that many users have already become accustomed to from electronic game-playing. The audio effects processor of the present invention is self-contained, i.e., it includes a complete signal processor which can itself serve as a primary sound source or a modifier for sound signals applied to it. Thus, by itself, it provides an essentially complete sound generation/modification system readily operable by both amateur and professional alike.

9 Claims, 3 Drawing Sheets

SOUND EFFECTS CONTROLLER

BACKGROUND OF THE INVENTION

The invention relates to the modification of musical signals and comprises an integrated controller for modifying sound in real time.

The electronic processing of musical signals has been undertaken in a wide variety of contexts, ranging from the professional studio to the strictly amateur music maker. The tools available in the two extreme environments, and their concomitant costs and results, vary greatly, and the amateur musician has generally been foreclosed from significant capabilities of music modification and enhancement, particularly in a performance environment.

Some attempts have been made to provide the individual musician with sound modification or enhancement on specific instruments. One example is set forth in U.S. Pat. No. 4,481,584, issued Nov. 13, 1984 to Paul Dugas and entitled "Control For Musical Instruments". This patent shows a pair of "joysticks" (FIG. 1, elements 7, 8) whose motion is used to provide simultaneous volume and panning control.

Another example is that set forth in U.S. Pat. 5,403,970, issued Aug. 4, 1995 to Eiichiro Aoki and entitled "Electrical Musical Instrument Using A Joystick-Type Control Apparatus". This patent describes a joystick device for generating control signals for a physical model of a bowed instrument, particularly performance parameters such as bow pressure, velocity, position, and the like (see col. 1,1.30ff).

Such devices are of limited applicability and use. They are specific to a particular type of musical instrument, and rely on that instrument for the fundamental tone on which they will operate. Their range of effects is limited, and shaped to the peculiarities of the instrument with which they are to be used.

Professional music studios have more nearly universal equipment for modifying sound. Such equipment typically provides a variety of effects to sound signals applied to it. e.g. flanging, phasor, reverberation, filtering, distortion, and the like. Some have even included a controller termed a "joystick" but apparently of the finger-grip type only: see, e.g, Red Sound Systems "FX Mixer ". Equipment of this type is expensive, typically built-in to fixed cabinetry, and generally requires significant skill and training to operate

SUMMARY OF THE INVENTION

Accordingly, it is an object of the invention to provide an improved musical sound controller.

Further, it is an object of the invention to provide a musical sound controller for controllably modifying musical sounds in real time.

Further, it is an object of the invention to provide a musical sound controller that is not restricted to a particular instrument or sound source.

Still a further object of the invention is to provide a musical sound controller of substantial processing power but economically accessible to the amateur musician.

Yet another object of the invention is to provide a musical sound controller of simplified design and construction suitable for the non-professional consumer.

BRIEF DESCRIPTION OF THE DRAWINGS

The foregoing, and other and further advantages and features of the invention, will be more readily understood on reference to the following detailed description of the invention, when taken in conjunction with the accompanying drawings, in which.

DETAILED DESCRIPTION OF AN ILLUSTRATIVE EMBODIMENT

In accordance with the present invention, we provide a self-contained audio effects processor having a handheld joystick from which both position-dependent and state-dependent effects are effectuated by means of motion of the joystick as well as by actuation of one or more buttons on the joystick. The position-dependent effects control the degree to which an effect is produced, e.g., the amount of intentional distortion applied to a signal, the amount of pitch-shift, etc.; these effects are produced primarily by selective directional motion of the joystick by the user. The state-dependent effects define the particular effect to be imparted to a signal being processed or produced in the processor, e.g., distortion, pitch-shift, etc.; these effects are selected largely by one more or buttons on the joystick which are preferably accessible from the same hand that grips the stick, thus providing a natural and convenient "feel" that many users have already become accustomed to from electronic game-playing. The audio effects processor of the present invention is self-contained, i.e., it includes a complete signal processor which can itself serve as a primary sound source or a modifier for sound signals applied to it. Thus, by itself, it provides an essentially complete sound generation/modification system readily operable by both amateur and professional alike.

Figure 1:
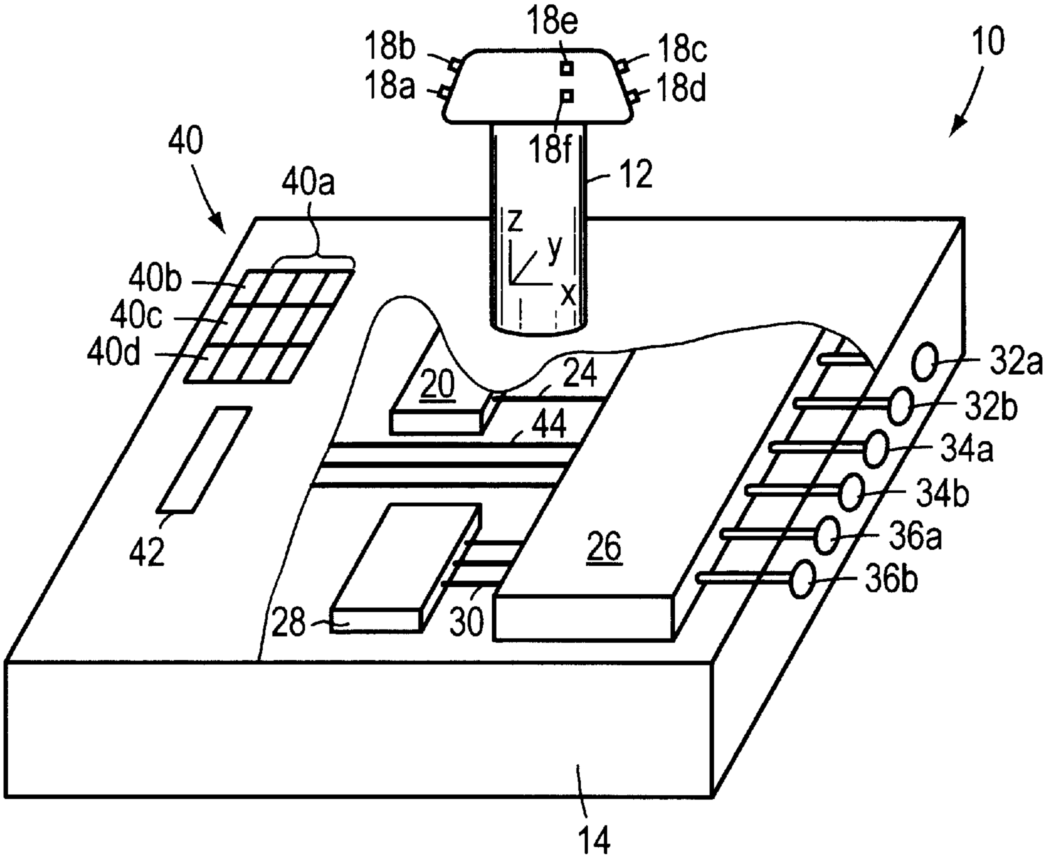
FIG. 1 is a pictorial view of an effects processor in accordance with the present invention.

Turning now specifically to FIG. 1, an integrated sound effects controller 10 in accordance with the present invention is formed from a joystick 12 mounted on a controller base 14. The joystick is of a type commonly utilized for computer games and the like. It has an elongated, rearwardly inclined body 16 for grasping by the user, and actuable switches or "buttons" 18*a*–18*f* for selecting effects modifications as described more fully hereinafter. It is mounted for rotation about three orthogonal axes x-y-z. In particular, the joystick may be moved by a user in a first direction +X/−X toward and away from the user and equivalent to a rotation about the y axis; in a second direction +Y/−Y from left to right with respect to the user and equivalent to a rotation about the x axis; and in a third direction +Z/−Z about its own longitudinal body axis and equivalent to a rotation about the z axis.

The joystick 12 provides outputs to a converter 20 which track movement of the joystick about its x, y, z axes, and also depression of one or more of the buttons 18 or other control elements that may be associated with the joystick. The converter 20 converts these outputs to MIDI-formatted digital signals for controlling a sound chip. The MIDI (Musical Instrument Digital Interface) format is a standard format commonly used in musical instruments for controlling sound information generation and processing. In one embodiment of the invention, the converter 20 comprised an analog-to-digital converter coupled to a MIDI conversion device made by the Technology Playgroup of Montreal, Canada. This converter is readily available, relatively inexpensive, and provides the desired MIDI interface. It will be understood that any converter which converts the rotational motion of the joystick, as well as its button actuations, to a form suitable for driving an effects processor as described below is appropriate.

The converter 20 supplies its outputs via leads 24 to a programmable digital signal processing (DSP) chip 26. A memory 28 connected to the chip by a bidirectional bus 30 provides substantial storage capacity (preferably on the order of megabits) to supplement the native memory in the digital signal processor. The chip 26 also has a first pair of input ports 32*a* and 32*b* for receiving a stereophonic audio signal to be modified and applying it the digital signal processor, and a first pair of output ports 34*a* and 34*b* for supplying the modified signal as output for subsequent processing or performance through loudspeakers of the like. It has a further input port 36*a* for receiving MIDI input signals, and a further output port 36*b* for supplying the processed MIDI signals as output to subsequent circuits or the like.

A keypad 40 on the base 14 has a numeric section 40*a* and a control section comprising map select key 40*b*, effects hold key 40*c*, and controller capture key 40*d*. A display 42 provides status and control information to the user. The keypad and display are connected to the digital signal processor by a bidirectional bus 44.

The chip 26 performs essentially all the signal processing to be performed on the audio and MIDI inputs. In particular, responsive to control inputs from the joystick 16, and/or to MIDI inputs at terminal 36*a*, the processor chip provides delay, reverberation, chorus, flange, phase, distortion, pan, filter, morphing, modulation, compression/expansion and other effects. To this end, the chip 26 is preferably a single-chip microcomputer providing basic DSP facilities (computation, data address generation, program sequencing) together with additional facilities such as on-board program and data memory, programmable timers, input/output ports, and a host interface. In the preferred embodiment of the invention, we have used the Analog Devices ADSP-2106X chip incorporating the "Csound" music processing software. "Csound" is a music synthesis and processing program developed by Professor Barry Vercoe at M.I.T. The software has over 300 functions that can be configured in a variety of combinations to provide a multiplicity of musical syntheses or effects. As used in the present invention, it responds to MIDI input signals to apply desired musical effects to sound signals applied to it from an external source, or generated internally.

Figure 2:
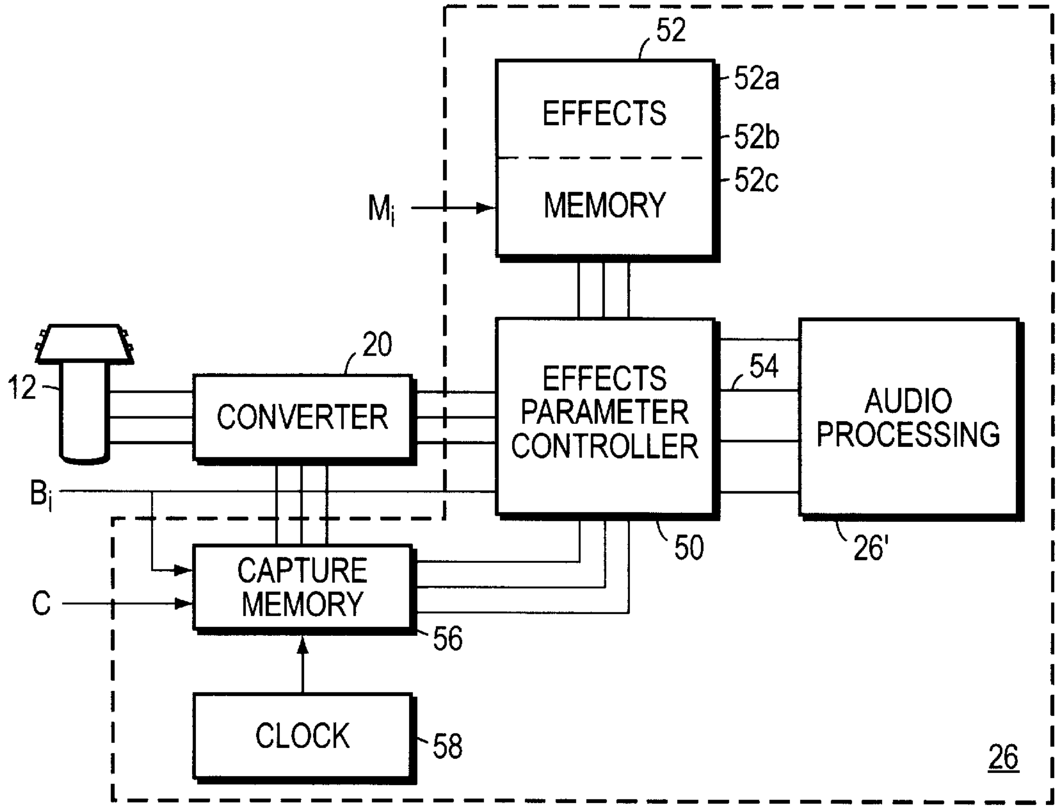
FIG. 2 is a functional block diagram illustrating the operation of the controller of the present invention in more detail.

FIG. 2 is a functional block diagram illustrating the controller of the present invention in more detail. The joystick 12 is coupled through the converter 20 to an effects parameter controller 50. An effects memory 52 responds to the map select button 40*b* (FIG. 1) to load into the controller 50 a "map" defining the relation between the inputs to the controller 50 from the converter 20 and the outputs 54 of the controller which are applied to the sound processor 26 over a bus 54. A "capture" memory 56 responds to activation of the capture key 40*d* and to one or more joystick buttons $B_i$ (elements 18*a*–18*f* of FIG. 1) to store a dynamic history of movement of the joystick and depression of the buttons over a defined period of time as synchronized by a clock 58. For example, the capture memory may receive from the converter 20 and store for subsequent use a string of values defining the movements of the joystick in the x, y, z direction over a period of time. This string can thereafter be applied to the effects parameter controller 50 which maps the string to a set of control values applied to the sound processor to thereby control the synthesis of a sound or modify its characteristics.

The map button 40*b* may operate in multiple modes. In its load mode, a single depression of the button followed by keying in of a number on the numeric keypad loads into the controller 50 a defined set of relationships among the selector buttons 18, the movement of joystick 14, and sets of effects corresponding to the number so input. These relationships may be programmed in advance or may be programmable by the user. For example, pressing the map button 40*b* twice in succession may be used to take the system into program mode. Thereafter, activation of a button 18 coupled with entry of one or more numbers on the numeric keypad 40*a* selects a corresponding number of parameters for association with that button in a parameter set. Movement of the joystick over a given range while the button is depressed may be used to establish the amplitude of the parameter control. Other selector buttons may be programmed in a similar manner. Completion of the programming is indicated by successive activation of the map button, followed by entry of a number by which the mapping Mi that has just been completed will be retrieved when needed.

Figure 3:
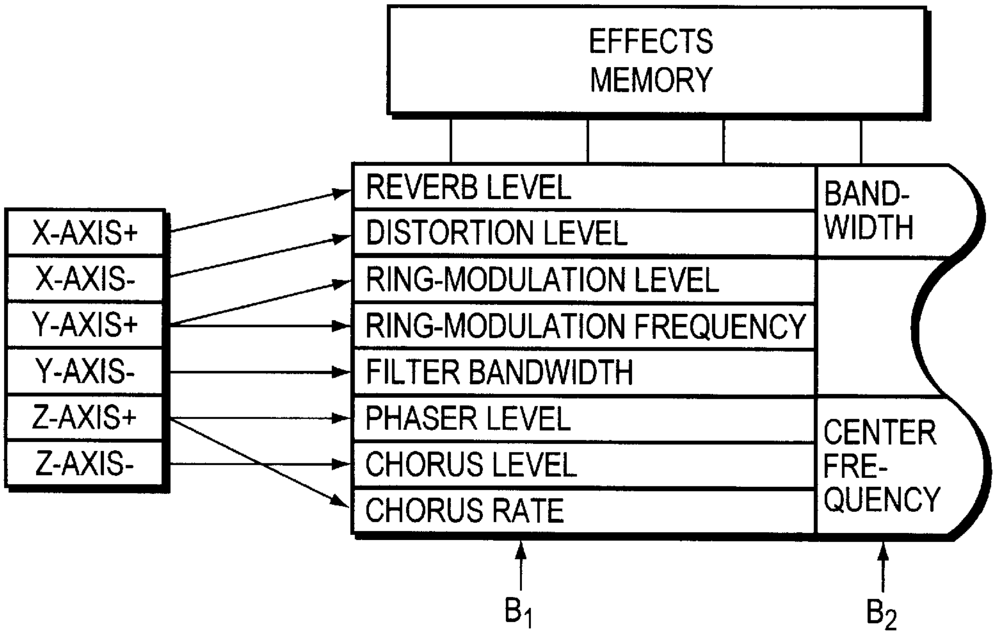
FIG. 3 is a block diagram of one embodiment of a parameter control matrix in accordance with the present invention.

FIG. 3 illustrates an illustrative mapping, e.g., $M_1$, between the position of the joystick and the specific parameters that are controlled responsive to its motion when a specific joystick selector button, $B_i$, is actuated. It will be noted that for some positions of the joystick a plurality of parameters are controlled. Further, it will be noted that motion of the joystick along a different axis may select different parameters for control along different portions of the axis. Thus, responsive to depression of button $B_1$, and selection of mapping $M_1$ via keyboard 40 (FIG. 1), the positive X-axis is associated with a reverberation effect, and motion along this axis changes the reverberation level. Similarly, the negative X-axis is associated with a distortion effect, and motion along this axis changes the level of distortion applied to the audio signal by the audio processor. The Y and Z axes are similarly associated with particular audio effects as indicated, and motion along these axes controls the level of the effects applied to audio processed by the system. It will be noted that the association is not restricted to one-to-one. For example, as indicated in FIG. 3, motion along the positive Z-axis may simultaneously provide both a phaser and a chorus effect, the extent to which these effects are applied being controlled by the extent of motion along that axis.

A much simpler mapping may be provided in response to depression of button $B_2$, for example. As shown in FIG. 3, the association for this button provides a filter whose bandwidth is controlled by movement of the joystick controller along the X-axis and whose center frequency is controlled by movement of the joystick along the Z-axis. Similar associations sets between motions of the joystick and one or more effects are established by the remaining buttons 18.

The buttons 18 thus provide a rapid method for changing the effects that one can apply to audio as it is playing in real time. The natural feel of the joystick and the ease with which it can be manipulated have proven to be a powerful aid in the creative manipulation of real-time audio, and thus most useful in its own right. However, we have further extended the capabilities of the controller by providing for a remapping of the button-effects associations by means of the keypad 40. In particular, a plurality of sets of mappings Mi, designated as 52_a_, 52_b_, 52_c_, etc., are stored in effects memory 52. A specific set is selected responsive to map selection key 40_b_ and stored in effects parameter controller 50 to establish a new set of associations between the buttons and the effects. To this end, map selection key 40_b_ may be actuated simultaneously with the one or more keys of the numeric keypad portion 40 a to select a desired mapping. This greatly extends the capabilities of the controller, and provides rapid setup for the user.

Figure 4:
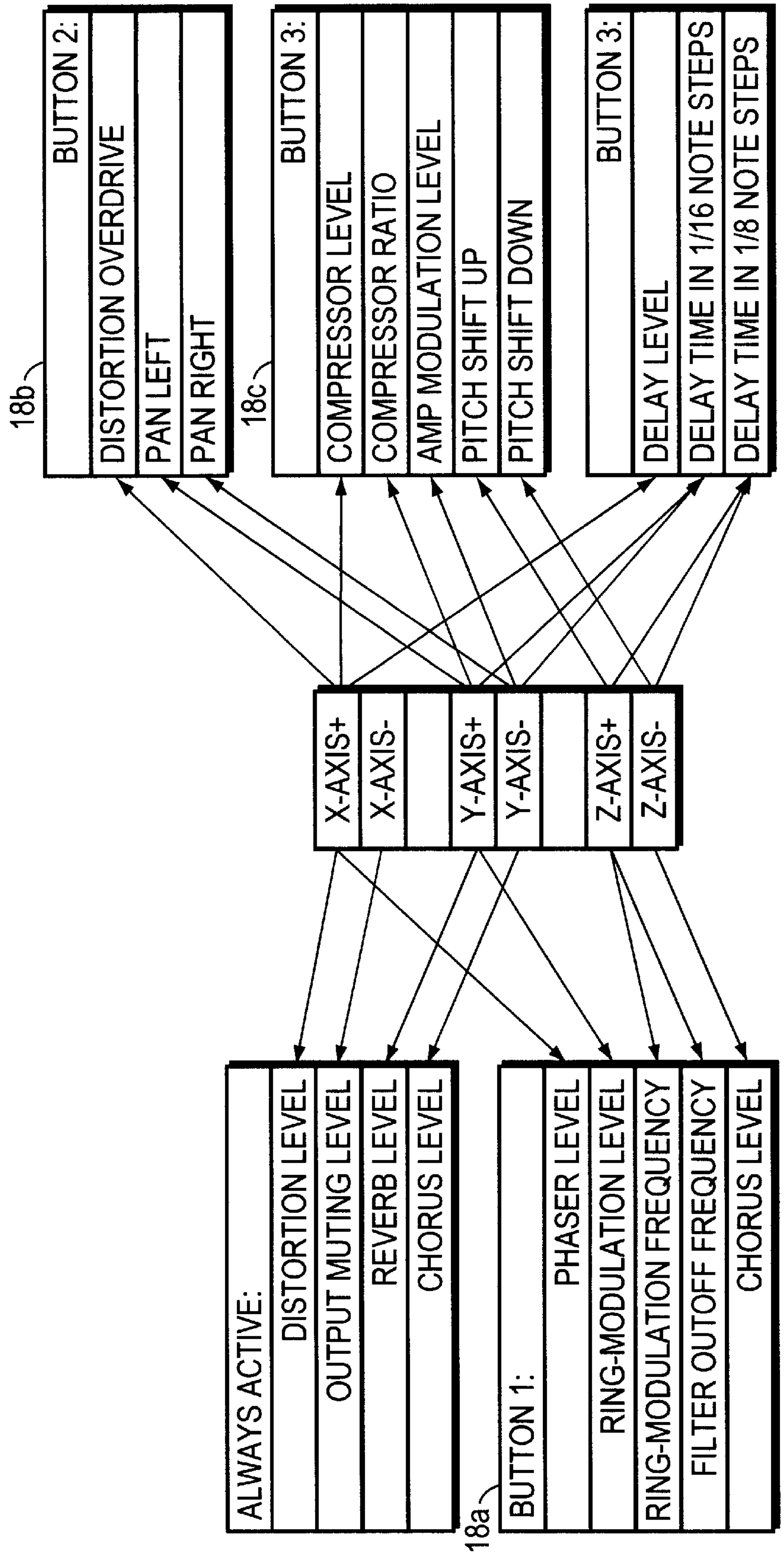
FIG. 4 is a block diagram of an embodiment of a more versatile parameter control matrix in accordance with the present invention.

FIG. 4 illustrates a more versatile, and thus more complex, parameter matrix in accordance with the present invention. A plurality of buttons, 18_a_–18_c_, map a variety of effects onto motion of the joystick 12 in the X, Y, or Z direction. The buttons may enable or disable the various effects, and may be operable simultaneously or mutually exclusive, or a combination of these. Certain effects may always be active, as shown in FIG. 4. For example, as indicated, the distortion level and output muting level may be assigned to the +X and −X axes, respectively, and the reverb level and chorus rate to the +Y and −Y axes, respectively, independent of the state of any of the buttons. Motion along the +X axis also controls the phaser level via button 18_a_; distortion overdrove via button 18_b_; and compressor level and delay level via button 18_c_.

Motion along the +Y axis controls the ring modulation level via button 18_a_; and left panning via button 18_b_; and compressor ratio and delay time (1/16th note steps) via button 18_c_. Right panning is controlled by motion along the −Y axis, as is delay time (also in 1/16th note steps). Motion along the +Z axis controls the ring modulation frequency and filter cutoff frequency via button 18_a_, as well as pitch shift and delay time in 1/8th note steps via button 18_c_. Finally, motion along the −Z axis controls the chorus level via button 18_a_, and pitch shift up and delay time (1/8th note steps).

With the setup of FIG. 4, an extraordinarily rich and varied palette of effects can be applied to music in real time in a simple and readily controllable manner.

What is claimed is:

1. A self-contained audio effects processor for modifying an audio signal applied thereto, comprising:

A. an audio signal processor for receiving said audio signal that is responsive to control inputs thereto to modify said audio signal applied thereto;

B. a joystick controller comprising a joystick and a plurality of user-manipulable selector controls, the controller providing position-dependent output signals indicative of position of said joystick in a plurality of directions;

C. means for associating said selector controls with respective sets of specific effects to be imparted based upon the position of the joystick to said audio signals applied to said audio signal processor;

D. means for applying said position-dependent output signals to said audio processor for controlling degree to which said audio signals are modified by a respective set of specific effects selected by user actuation of said controls;

wherein respective user-manipulations of the selector controls select which of the respective sets of specific effects is to be imparted to the audio signals, and the degree to which specific effects comprised in the selected respective set of specific effects modify the audio signals is selected based upon the position of the joystick.

2. An audio effects processor according to claim 1 in which the means for associating said selector controls and said sets of effects comprises a memory having a plurality of relationships between said controls and said sets of effects stored therein.

3. An audio effects processor according to claim 2 in which said memory stores a plurality of sets of said relationships and which includes means for selecting among said relationships.

4. An audio effects processor according to claim 3 in which said relationships include at least one one-to-many relationships between a joystick position and a plurality of control parameters.

5. An audio effects processor according to claim 3 in which said selecting means includes a display for displaying an identifier for a parameter set to be selected.

6. An audio effects processor according to claim 3 which includes means for holding states of selector buttons and joystick position after release of said buttons and said joystick to thereby maintain control of processing in accordance with the parameters associated with the buttons and joystick positions after release thereof.

7. An audio effects processor according to claim 3 which includes means to capture and store the settings defined by states of selector buttons and joystick position.

8. A self-contained audio effects processor comprising:

A. a base enclosing a processor for imparting audio effects to a signal being received and processed by said processor; and B. a handheld joystick mounted on said base and in electrical communication with said processor, said joystick providing control of amount of one or more effects in a set of effects to be imparted to said signal responsive to translational and/or movement of said joystick; the set of effects being selected by user-manipulation of selector controls, the set of effects being one of a plurality of respective sets of effects selectable by the user-manipulation of the selector controls.

9. A self-contained audio effects processor according to claim 8 in which said processor implements a Csound audio processing system.

* * * * *